United States Patent
Noorbakhsh et al.

(10) Patent No.: US 6,983,892 B2
(45) Date of Patent: Jan. 10, 2006

(54) GAS DISTRIBUTION SHOWERHEAD FOR SEMICONDUCTOR PROCESSING

(75) Inventors: Hamid Noorbakhsh, Fremont, CA (US); James D. Carducci, Sunnyvale, CA (US); Jennifer Y. Sun, Sunnyvale, CA (US); Larry D. Elizaga, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 136 days.

(21) Appl. No.: 10/772,787

(22) Filed: Feb. 5, 2004

(65) Prior Publication Data

US 2005/0173569 A1   Aug. 11, 2005

(51) Int. Cl.
*A01G 27/00* (2006.01)
*B05B 5/00* (2006.01)
*B05B 1/14* (2006.01)
*F23D 11/32* (2006.01)

(52) U.S. Cl. ............ 239/67; 239/690; 239/690.1; 239/696; 239/596; 239/553.3

(58) Field of Classification Search .......... 239/67, 239/690, 690.1, 692, 696, 706, 708, 596, 239/600, 590.3, 553.14, 553.3; 118/719, 118/728, 620
See application file for complete search history.

(56) References Cited

U.S. PATENT DOCUMENTS

| | | | |
|---|---|---|---|
| 5,451,290 A | 9/1995 | Salfelder | 216/67 |
| 5,614,026 A | 3/1997 | Williams | 118/723 ME |
| 5,781,693 A | 7/1998 | Ballance et al. | 392/416 |
| 5,976,261 A | 11/1999 | Moslehi et al. | 118/719 |
| 6,015,503 A | 1/2000 | Butterbaugh et al. | 216/66 |
| 6,050,506 A | 4/2000 | Guo et al. | 239/558 |
| 6,086,677 A | 7/2000 | Umotoy et al. | 118/715 |
| 6,182,603 B1 | 2/2001 | Shang et al. | 118/723 ME |
| 6,245,396 B1 * | 6/2001 | Nogami | 427/562 |
| 6,302,964 B1 | 10/2001 | Umotoy et al. | 118/715 |
| 6,432,259 B1 | 8/2002 | Noorbakhsh et al. | 156/345.33 |
| 6,435,428 B2 | 8/2002 | Kim et al. | 239/553 |
| 6,444,042 B1 | 9/2002 | Yang et al. | 118/724 |
| 6,500,299 B1 | 12/2002 | Mett et al. | 156/345 |
| 6,555,166 B2 | 4/2003 | Gluschenkov et al. | 427/248.1 |
| 6,586,886 B1 | 7/2003 | Katz et al. | 315/111.21 |
| 6,605,177 B2 | 8/2003 | Mett et al. | 156/345.53 |
| 6,758,224 B2 * | 7/2004 | Nogami | 134/22.1 |

(Continued)

FOREIGN PATENT DOCUMENTS

WO    WO 02/08487 A1    1/2002

*Primary Examiner*—Davis Hwu
(74) *Attorney, Agent, or Firm*—Shirley L. Church

(57) ABSTRACT

We have developed a gas distribution showerhead assembly, for use in a semiconductor processing chamber, which can be easily cleaned, with minimal chamber downtime. The gas distribution showerhead assembly includes an electrode having openings therethrough, and a gas distribution plate which includes a plurality of through-holes for delivering processing gases into the semiconductor processing chamber. The gas distribution plate is bonded to a first, lower major surface of the electrode. A removable insert which fits into an opening in the electrode through which gas flows. Spacing between surfaces of the removable insert and surfaces of the electrode is adequate to permit gas flow, but inadequate for plasma ignition within the opening. The removable insert can be easily removed during cleaning of the gas distribution showerhead, permitting the holes in the gas distribution plate to be easily accessed from both sides of the gas distribution plate.

19 Claims, 6 Drawing Sheets

U.S. PATENT DOCUMENTS

| | | |
|---|---|---|
| 2001/0006070 A1 | 7/2001 | Shang et al. .................... 134/1 |
| 2002/0127853 A1 | 9/2002 | Hubacek et al. ............ 438/689 |
| 2002/0192379 A1 | 12/2002 | Metzner et al. .......... 427/248.1 |
| 2003/0106490 A1 | 6/2003 | Jallepally et al. ............. 117/89 |

\* cited by examiner

GAS DISTRIBUTION SHOWERHEAD FOR SEMICONDUCTOR PROCESSING

FIELD OF THE INVENTION

The present invention pertains to a gas distribution showerhead assembly for use in a semiconductor processing chamber.

BRIEF DESCRIPTION OF THE BACKGROUND ART

Semiconductor manufacturing processes utilize a wide variety of gases, such as fluorine-based gases, chlorine-based gases, silanes, oxygen, nitrogen, organic gases (such as hydrocarbons and fluorocarbons), and noble gases (such as argon or helium). In order to provide uniform distribution of processing gases into a semiconductor processing chamber (such as an etch chamber or a deposition chamber), a "showerhead" type gas distribution assembly has been adopted as a standard in the semiconductor manufacturing industry. Several current showerhead designs are summarized below.

U.S. Pat. No. 5,451,290, issued Sep. 19, 1995, to Salfelder, discloses a quartz gas distribution plate containing a number of gas inlet holes having cross-sectional areas sufficiently small to prevent plasma from being present in the gas inlet holes, to inhibit formation of polymer material and flaking of contamination particles therefrom. The gas inlet holes are formed on the surface of the quartz gas distribution plate directly over a wafer being processed. Alternatively, the gas inlet holes are formed in the quart plate to radially extend to the peripheral edge of the quartz plate, so that contamination particles are said to fall outside the bounds of a wafer beneath the quartz plate. (Abstract)

U.S. Pat. No. 5,614,026, issued Mar. 25, 1997, to Williams, discloses a showerhead designed to provide uniform distribution of process gas, where the showerhead includes a plurality of gas inlets for supplying process gas to a semiconductor substrate surface, and a plurality of gas outlets for removing gas and volatile byproducts produced as a result of reaction of the process gas with the substrate surface. Each gas inlet is concentrically positioned within a respective gas outlet. The showerhead is said to improve the utilization of process gas species at the substrate surface by providing gas flow in a direction perpendicular to the substrate surface and avoiding flow of the process gas or volatile byproducts laterally across the substrate surface. The showerhead is said to be useful for uniform stripping of a mask of organic material by direct contact of the incoming reactive gas with the substrate surface and immediate removal of the process gas and volatile byproducts through the concentrically arranged gas outlets. (Abstract)

U.S. Pat. No. 5,781,693, issued Jul. 14, 1998, to Ballance et al., discloses a showerhead for use with a lamp head in a thermal processing chamber. The lamp head includes a high intensity source which emits radiation that heats a substrate within the chamber. The showerhead includes a top window on a side of the showerhead that is adjacent to the lamp head; a bottom window on a side of the showerhead that is adjacent to the substrate during processing; and a gas supply inlet through which a gas is introduced into a space between the top and bottom windows, where the top and bottom windows are transparent to the radiation from the source in the lamp head, and where the bottom window includes a plurality of gas distribution holes through which gas is injected from the space between the top and bottom windows into the chamber. (Abstract)

U.S. Pat. No. 5,976,261, issued Nov. 2, 1999, to Moslehi et al., discloses a multi-zone gas injection apparatus which uses a gas injection plate with multiple injection zones to deliver multiple process gases into a chamber for deposition onto a workpiece (for example, a silicon wafer). The gas showerhead separates the multiple process gases in a manner that is said to avoid premixing of the gases, thereby minimizing gas-phase nucleation and particulate generation. The showerhead is said to allow real-time independent control over the gas flow rates in N channels to achieve deposition uniformity. (Abstract)

U.S. Pat. No. 6,050,506, issued Apr. 18, 2000, to Guo et al., discloses a showerhead used for dispensing gas over a wafer in chemical vapor deposition (CVD), especially for CVD of metals. The pattern of holes is tailored to compensate for thermal and other effects, in particular by increasing the density of holes toward the periphery of the wafer in three or more zones. Such a variable pattern is said to be particularly useful for liquid precursors that are atomized in a carrier gas, in which case a second perforated plate in back of the showerhead face can be elminated, thereby reducing the flow impedance and the required pressure of the liquid-entrained gas, which tends to deposit out at higher pressures. (Abstract)

U.S. Pat. No. 6,086,677, issued Jul. 11, 2000, to Umotoy et al., discloses a faceplate for a showerhead of a semiconductor wafer processing system having a plurality of gas passageways to provide a plurality of gases to the process region without commingling those gases before they reach the process region within a reaction chamber. The showerhead contains a faceplate and a gas distribution manifold assembly. The faceplate defines a plurality of first gas holes that carry a first gas from the manifold assembly through the faceplate to the process region, and a plurality of channels that couple a plurality of second gas holes to a plenum that is fed the second gas from the manifold assembly. (Abstract)

U.S. Pat. No. 6,182,603, issued Feb. 6, 2001, to Shang et al., discloses a surface-treated showerhead for use in a substrate processing chamber. The showerhead includes a surface treatment, such as a non-anodized aluminum outer layer, an electro-polished surface of bare aluminum, or a fluorine-based protective outer layer. The surface-treated showerhead is designed to improve the rate of removal of materials deposited on the interior surfaces of the chamber during cleaning, reduces contamination of substrates during processing, and provides more efficient use of the power source used for heating the substrate during processing. (Abstract)

U.S. Pat. No. 6,586,886, issued Jul. 1, 2003, to Katz et al., discloses a gas distribution plate electrode for a plasma reactor. The gas distribution plate includes a front plate in the chamber and a back plate on an external side of the front plate. The gas distribution plate comprises a gas manifold adjacent the back plate. The back and front plates are bonded together, forming an assembly. The assembly includes an array of holes through the front plate and communicating with the chamber, and at least one gas flow-controlling orifice through the back plate and communicating between the manifold and at least one of the holes. The orifice has a diameter which determines gas flow rate to the at least one hole. In addition, an array of baffles (pucks) is at least generally congruent with the array of holes and disposed within respective ones of the holes to define annular gas passages for gas flow through the front plate into the chamber. Each of the annular gas passages is non-aligned with the orifice. (Abstract)

A cross-sectional schematic of one prior art showerhead assembly is shown in FIG. 1A. The showerhead assembly 100 includes an electrode 104 and a gas distribution plate 102. FIG. 1B shows a top view of gas distribution plate 102. Numerous tiny through-holes 108 are machined in gas distribution plate 102, through which various processing gases flow into a semiconductor processing chamber (not shown). In order to prevent a plasma from igniting in the through-holes 108, the holes typically have a diameter of about 0.020 inch or less (more typically, about 0.010–0.015 inch). During semiconductor processing, polymeric contaminants (by-products of etch or deposition processes) build up on the surface 110 of gas distribution plate 102. These polymeric contaminants can flake off and contaminate a semiconductor substrate (not shown) within the processing chamber. Therefore, when these polymeric contaminants build up to a critical level (as determined by the semiconductor manufacturer), the showerhead must be cleaned, resulting in chamber downtime and loss of productivity.

Polymeric contaminants typically do not build up inside through-holes 108 during semiconductor processing, because of the process gases flowing through the holes 108 during etch or deposition processes. However, during a cleaning process, these polymeric contaminants can get pushed up into through-holes 108 and into the cavity 106 between gas distribution plate 102 and electrode 104 (shown in FIG. 1A). Like the through-holes 108, a portion of cavity 106 typically has a diameter of about 0.020 inch or less, in order to prevent a plasma from igniting in cavity 106. Once through-holes 108 and/or cavity 106 become filled with contaminants, they can be extremely difficult to clean, because of their small size.

It would therefore be desirable to provide a gas distribution showerhead assembly which could be easily cleaned, with minimal chamber downtime.

SUMMARY OF THE INVENTION

Disclosed herein is a gas distribution showerhead assembly for use in a semiconductor processing chamber, such as an etch chamber or a chemical vapor deposition (CVD) chamber. The gas distribution showerhead assembly of the invention includes an electrode having openings therethrough, and a gas distribution plate which includes a plurality of through-holes for delivering processing gases into the semiconductor processing chamber. The gas distribution plate is attached (typically bonded) to a first, lower major surface of the electrode.

The gas distribution showerhead assembly further includes a removable insert which fits into an opening in the electrode through which gas flows. Spacing between surfaces of the removable insert and surfaces of the electrode is adequate to permit gas flow, but inadequate for plasma ignition within the opening. The removable insert may be a removable pin plate which includes a plurality of pins. The removable pin plate is disposed over a second, upper surface of the electrode in a manner such that the plurality of pins fit within the openings in the electrode. A pin fills the majority of a space within the electrode. The removable pin plate is in position, with the pins in place within the electrode openings, during use of the gas distribution showerhead.

The removable pin plate can be easily removed from the second, upper surface of the electrode during cleaning of the gas distribution showerhead. This permits the holes in the gas distribution plate to be easily accessed from both sides of the gas distribution plate, so that any contaminants that become entrapped in the holes of the gas distribution plate during a cleaning process can be easily removed.

To prevent a plasma from igniting within the showerhead assembly during a semiconductor manufacture processing procedure, the gap between the exterior surface of any one pin and the electrode opening surface is typically 0.030 inch or less; more typically, 0.020 inch or less; and, most typically, within the range of about 0.010 inch to about 0.015 inch.

DETAILED DESCRIPTION OF THE INVENTION

Disclosed herein is a gas distribution showerhead assembly for use in a semiconductor processing chamber, such as an etch chamber or a chemical vapor deposition (CVD) chamber, for example and not by way of limitation. The gas distribution showerhead assembly of the invention includes an electrode having openings therethrough, and a gas distribution plate which includes a plurality of through-holes for delivering processing gases into the semiconductor processing chamber. The gas distribution plate is attached (typically bonded) to a first, lower major surface of the electrode.

The gas distribution showerhead assembly further includes a removable insert which fits into an opening in the electrode through which gas flows. Spacing between surfaces of the removable insert and surfaces of the electrode is adequate to permit gas flow, but inadequate for plasma ignition within the opening. The removable insert may be a removable pin plate which includes a plurality of pins. The removable pin plate is disposed over a second, upper surface surface of the electrode in a manner such that the plurality of pins fit within the openings in the electrode. A pin fills the majority of a space within the electrode. The removable pin plate is in position, with the pins in place within the electrode openings, during use of the gas distribution showerhead.

The removable pin plate can be easily removed from the second, upper surface of the electrode during cleaning of the gas distribution showerhead. This permits the holes in the gas distribution plate to be easily accessed from both sides of the gas distribution plate, so that any contaminants that become entrapped in the holes of the gas distribution plate during a cleaning process can be easily removed.

As a preface to the detailed description, it should be noted that, as used in this specification and the appended claims, the singular forms "a", "an", and "the" include plural referents, unless the context clearly dictates otherwise.

The gas distribution showerhead assembly of the invention is described in detail below with reference to FIGS. 2A–2D.

Figure 1A:
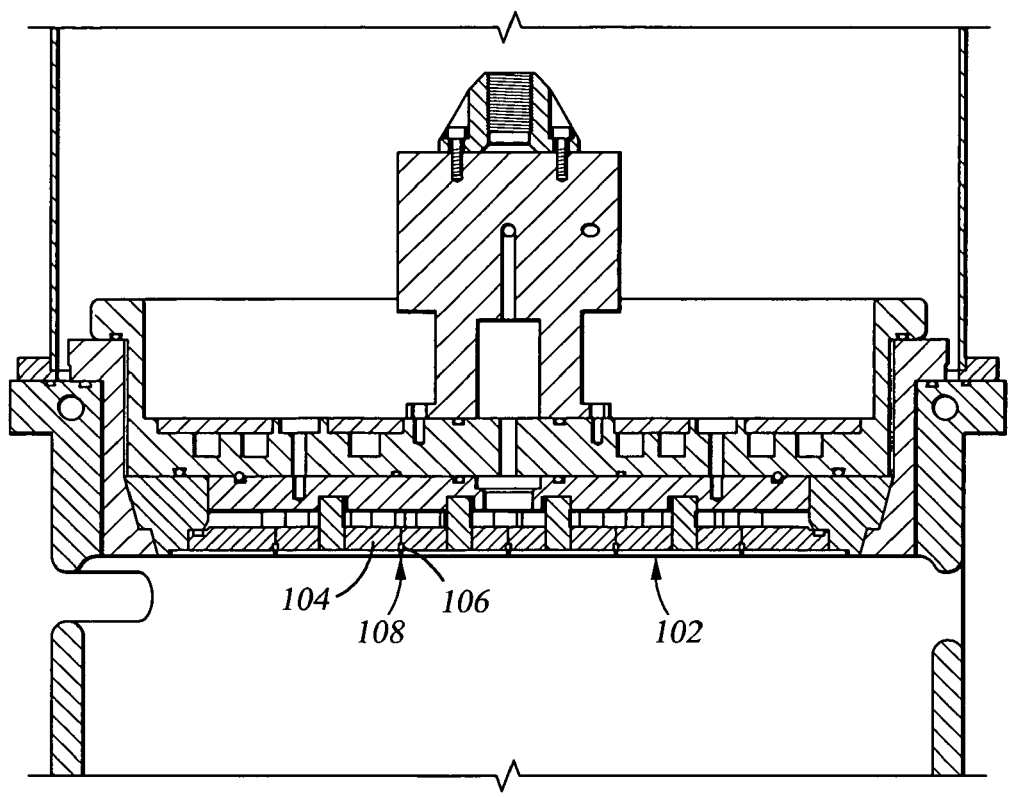
FIG. 1A is a cross-sectional schematic of a prior art showerhead assembly. The showerhead assembly 100 includes an electrode 104 with cavities 106, bonded to a gas distribution plate 102.
Figure 1B:
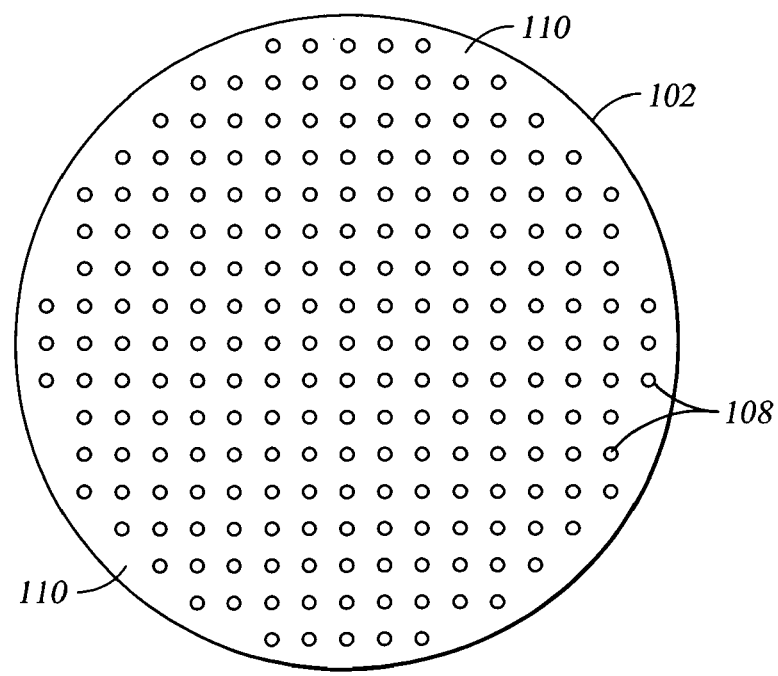
FIG. 1B shows a top view of gas distribution plate 102. Numerous tiny through-holes 108 are machined in gas distribution plate 102, through which various processing gases flow into a semiconductor processing chamber (not shown).
Figure 2A:
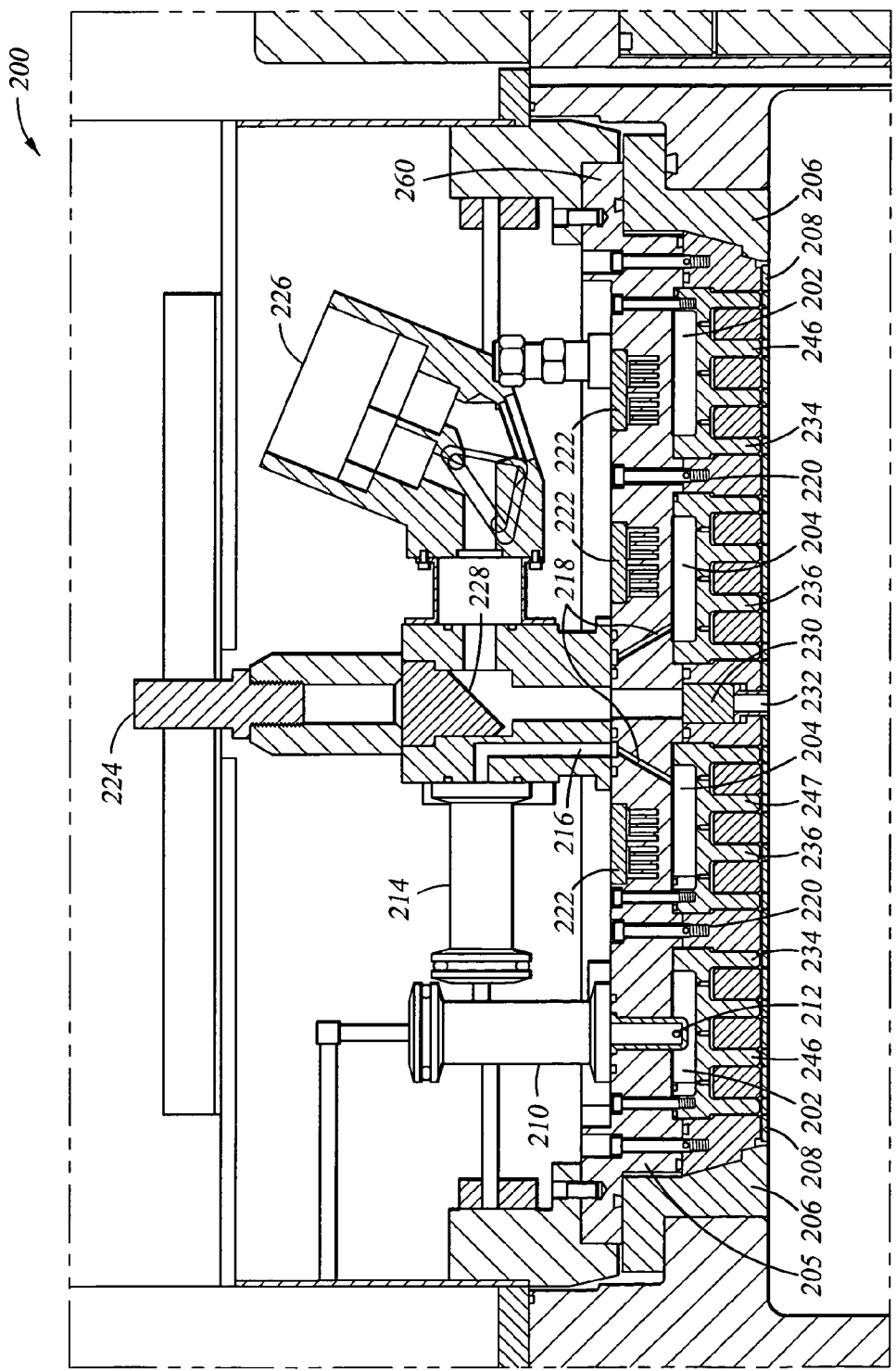
FIG. 2A is a cross-sectional schematic of one gas distribution showerhead assembly 200 according to the present invention, which is adapted for use in an Applied Materials' eMAX™ etch chamber which is capable of processing 300-mm diameter substrate wafers ("300-mm eMAX™").

FIG. 2A is a cross-sectional schematic of a gas distribution showerhead assembly according to the present invention, which is adapted for use in an Applied Materials' eMAX™ etch chamber which is capable of processing 300-mm diameter substrate wafers ("300-mm eMAX™"). The showerhead assembly 200 includes outer gas plenum 202, inner gas plenum 204, a chill plate 205, an electrode 206, and a gas distribution plate 208. Processing gases flow through outer gas feedthrough 210, through gas zone II diffuser 212, into outer gas plenum 202; and through inner gas feedthrough 214, through lines 216 and 218, into inner gas plenum 204. The inner and outer gas distribution zones are divided by gas zone divider 220, which is also used for cooling gas distribution plate 208. The showerhead assembly 200 also includes high efficiency cooling channels 222. The showerhead assembly further includes RF feedthrough 224 and matching network (not shown); iRM optical endpoint detection system 226; iRM reflector mirror assembly 228; quartz optical window 230; and silicon carbide iRM window 232.

Figure 2B:
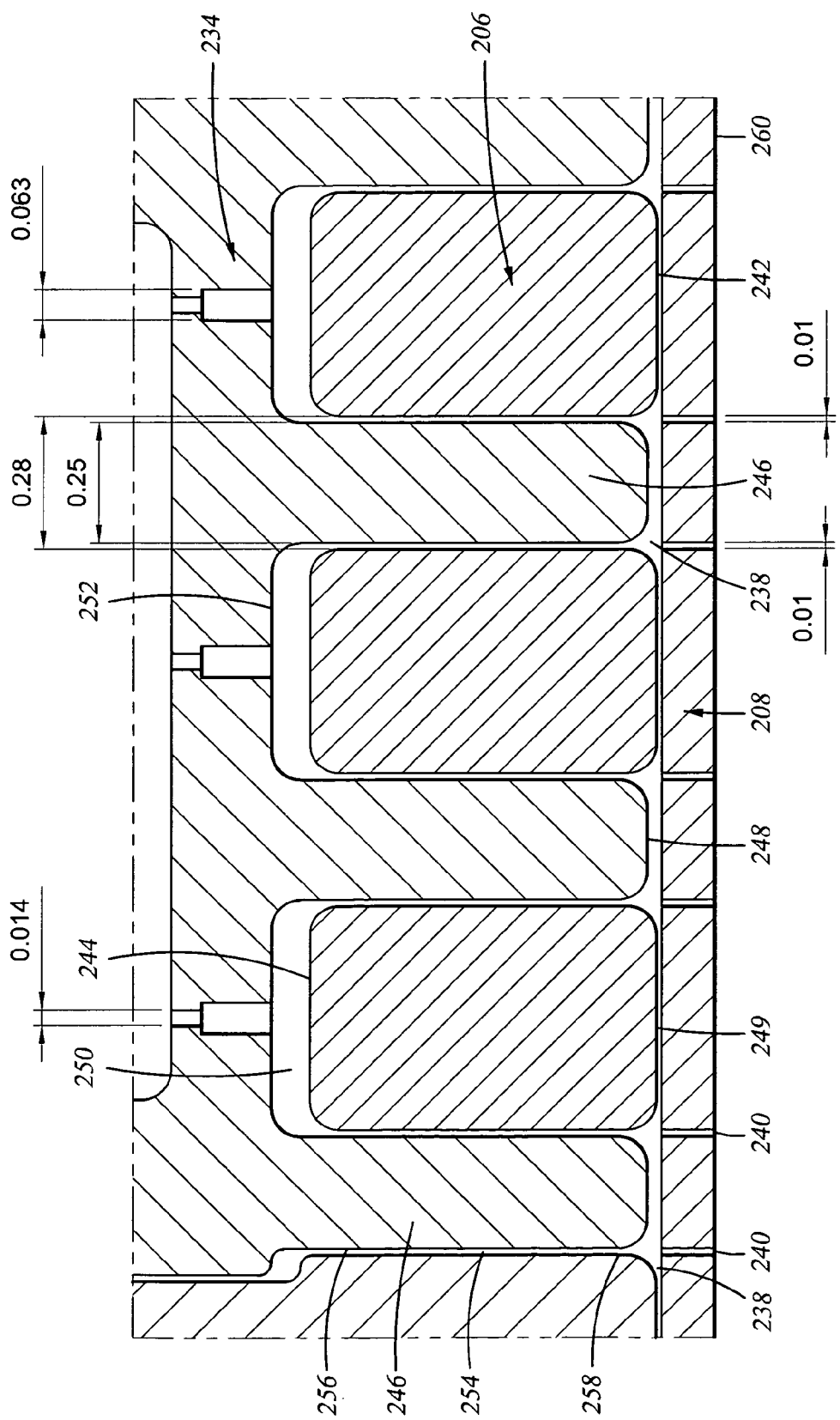
FIG. 2B shows a schematic of an expanded cross-sectional view of a portion of the gas distribution showerhead assembly 200 shown in FIG. 2A, which shows some of the critical dimensions for various components of the showerhead assembly 200, which illustrate how easily small openings could become plugged during cleaning if pins 246 were not removable during cleaning. (All dimensions are in inches.)

FIG. 2B shows a schematic of an expanded cross-sectional view of the outer pin plate 234, electrode 206, and gas distribution plate 208 of the gas distribution showerhead assembly 200 shown in FIG. 2A. The electrode 206 includes a plurality of through-holes 238. The electrode 206 can be made of aluminum, ceramic, Si—Si carbide, or graphite converted to silicon carbide, for example and not by way of limitation. In this case, the electrode 206 was made of anodized aluminum. Anodized aluminum is particularly preferred because it reduces metal contamination.

The gas distribution plate 208 can be made of silicon carbide, yttrium oxide, anodized aluminum, ceramic, quartz, or silicon, for example and not by way of limitation. In this case, the gas distribution plate 208 was made of silicon carbide. The gas distribution plate 208 was bonded to a first, lower major surface 242 of electrode 206. Bonding of gas distribution plate 208 to electrode 206 was accomplished using a silicone-based adhesive with different types of fillers tailored for enhancing thermal conductivity. Filler types include Al, $Al_2O_3$, and boron nitride. In this case, the silicon-based adhesive layer had a thickness within the range of 0.005 inch to 0.007 inch, and was cured at a temperature of about 100° C. The time period required for curing of the adhesive will typically range from about 1 hour to about 12 hours; more typically, from about 4 hours to about 12 hours. The curing time will depend on the particular adhesive used and its recommended curing temperature. (For example, a higher curing temperature will require a shorter curing time.) Suitable silicone-based adhesives are available, for example and not by way of limitation, from Dow Corning (Midland, Mich.); Rhone-Poulenc (France); and NuSil (Carpinteria, Calif.).

Bonding of gas distribution plate 208 to electrode 206 can be accomplished using other materials and/or methods known in the art. However, bonding of gas distribution plate 208 to electrode 206 should be performed using a bonding material which has enough compliance to prevent delamination due to thermal mismatch between the gas distribution plate 260 and the electrode 206.

Gas distribution plate 208 includes a plurality of through-holes 240 for delivering processing gases into the interior of a semiconductor processing chamber. The through-holes 240 in the gas distribution plate 208 can be, for example and without limitation, round or crescent-shaped. Crescent-shaped through-holes are preferred because they permit an increased gas flow without possibility of plasma ignition in the through-holes 240. The spacing between walls of the crescent is large enough to permit gas flow, but too small to permit plasma ignition in the opening, and is typically less than about 0.020 inch; more typically, within the range of about 0.010 inch to about 0.015 inch. The use of crescent-shaped through-holes in a gas distribution plate for a showerhead assembly is described, for example, in commonly owned, copending U.S. application Ser. No. 10/754,280, filed Jan. 8, 2004, of Daniel Hoffman et al., entitled "Plasma Reactor With Overhead RF Source Power Electrode with Low Loss, Low Arcing Tendency and Low Contamination".

A removable pin plate (as shown in FIG. 2A), which, in the 300-mm eMAX™ etch chamber, comprises outer pin plate 234 and inner pin plate 236, is positioned above a second, upper surface 244 of electrode 206 in a manner such that a plurality of pins 246, 247, extend into through-holes 238 of electrode 206. The removable pin plates 234 and 236 can be made of aluminum, ceramic, Si—Si carbide, or graphite converted to silicon carbide, for example and not by way of limitation. In this case, the inner and outer pin plates 234 and 236 were machined from aluminum, and then anodized to prevent aluminum contamination in the gas passages.

As illustrated in FIG. 2B, the spacing 250 between the upper surface 244 of electrode 206 and the lower surface 252 of pin plate 234 is typically within the range of about 0.010 inch to about 0.060. In this case, the spacing 250, which also assists in fluid control, was 0.040 inch.

The spacing between the bottom surface 248 of each pin 246 and the upper surface 249 of gas distribution plate 208 is typically within the range of about 0.010 inch to about 0.030 inch. In this case, the distance between the bottom surface 248 of each pin 246 and the upper surface 249 of gas distribution plate 208 (which also assists in fluid control) was about 0.020 inch.

In order for process gases to flow from gas plenums 202 and 204 out through gas distribution plate 208 and into the interior of a semiconductor processing chamber (not shown), there must be gaps between the exterior surface 256 of each pin 246 and the surface 258 of the electrode opening 238. The spacing 254 between the sidewalls 256 of each pin 246 and the walls 258 of electrode 206 opening 238 is sized to prevent plasma from arcing into this space, and is typically less than 0.030 inch; more typically, less than 0.020 inch; and, most typically, within the range of about 0.010 inch to about 0.015 inch.

Figure 2C:
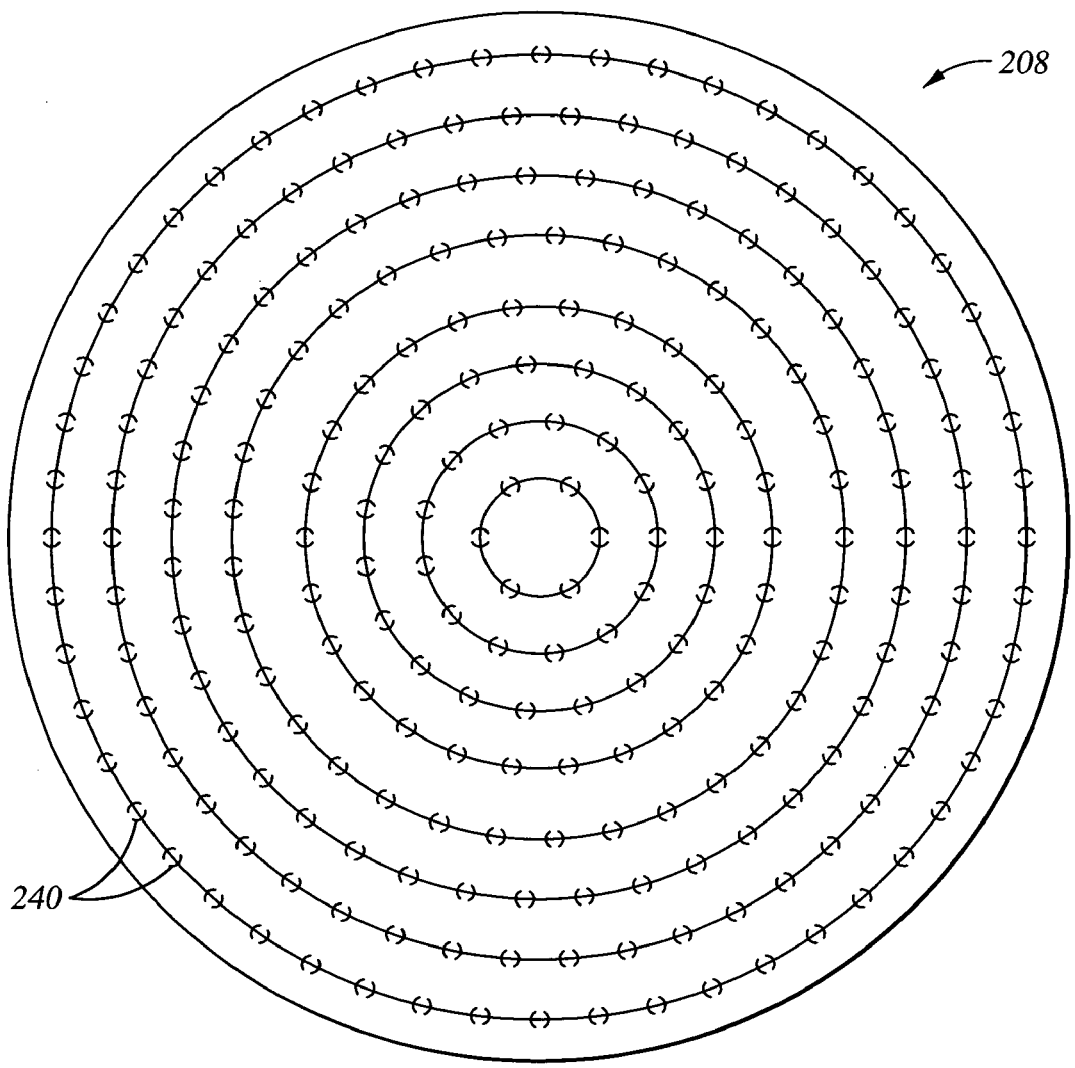
FIG. 2C shows a top view of gas distribution plate 208. The gas distribution plate 208 includes a total of 468, crescent-shaped through-holes 240, where the spacing between walls of the crescent is about 0.010 inch. The crescent-shaped through-holes 240 are spaced approximately 0.80 inch apart from each other.

In the Applied Materials' 300-mm eMAX™ etch chamber, the electrode 206 includes a total of 234 through-holes 238. The inner and outer pin plates 234, 236 together include a total of 234 pins 246, 247, which fit into through-holes 238 of electrode 206. FIG. 2C shows a top view of gas distribution plate 208 which includes a total of 468 (two for each of the 234 through-holes and pins) crescent-shaped through-holes 240, where the spacing between walls of the crescent is about 0.010 inch maximum. (The number of through-holes will depend on the amount of gas flow needed.) The crescent-shaped through-holes 240 are spaced approximately 0.80 inch apart from each other. In this case, the through-holes 240 were formed in a silicon carbide gas distribution plate 208 by ultrasonic machining. The silicon carbide gas distribution plate 208 has a thickness of 0.100 inch and a diameter of 14.23 inch.

Figure 2D:
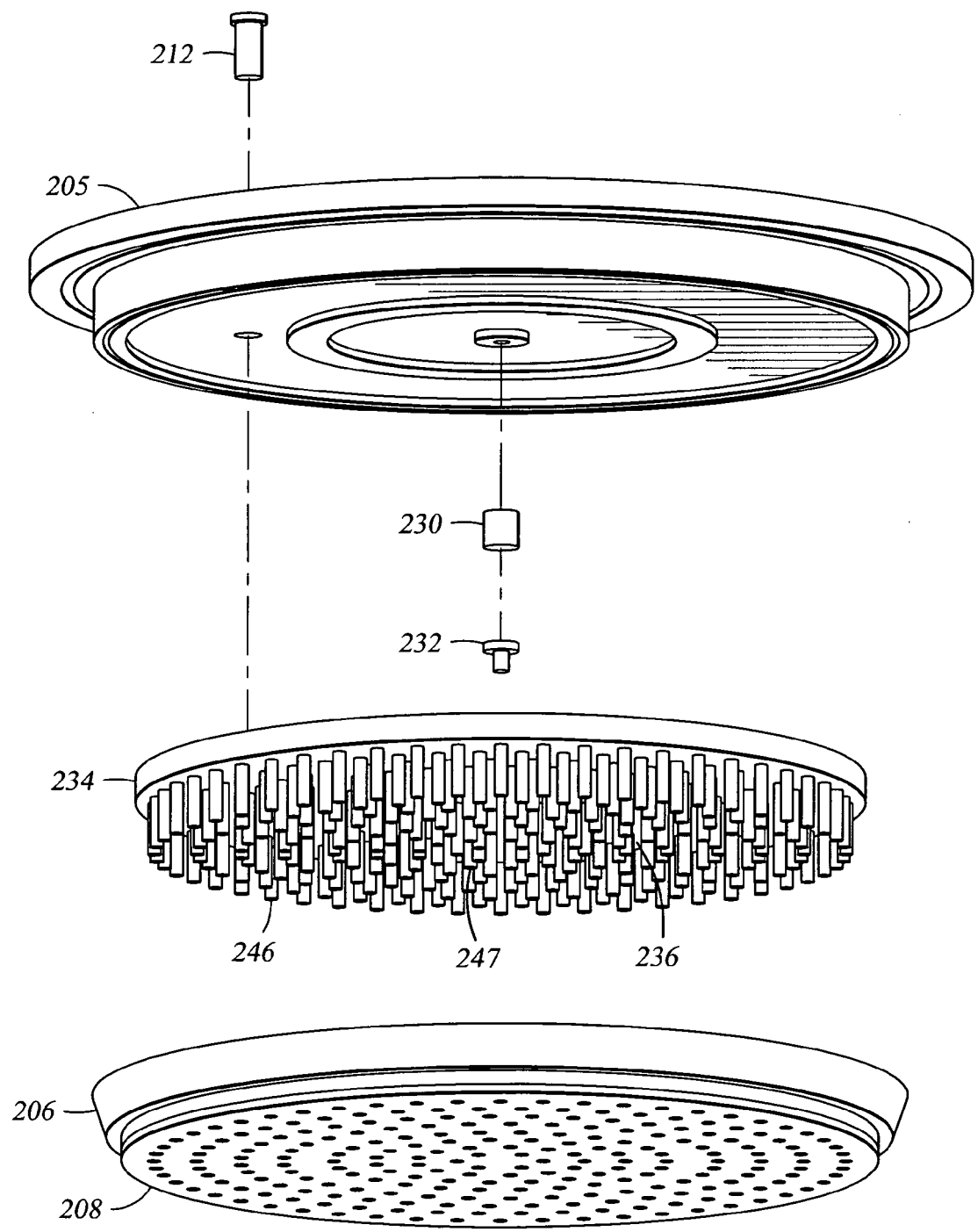
FIG. 2D shows an expanded, three-dimensional side view of a gas distribution showerhead assembly 200, showing how the various components of the showerhead assembly 200 fit together.

FIG. 2D shows an expanded, three-dimensional side view of a gas distribution showerhead assembly 200, showing how the various components of the showerhead assembly 200 fit together. The outer and inner pin plates 234, 236 are attached to chill plate (lid) 205. The pins 246, 247 of outer and inner pin plates 234 and 236 (respectively) fit into openings (not shown in FIG. 2D; indicated by reference numeral 238 in FIG. 2B) in electrode 206. Silicon carbide gas distribution plate 208 is typically bonded to aluminum electrode 206. Also shown in FIG. 2D are gas zone II diffuser 212; quartz optical window 230; and silicon carbide iRM window 232.

Because the pin plates are attached to the chill plate (lid) 205, the pin plates can be removed by removing the pin plate/lid assembly. Referring back to FIG. 2B, removal of the pin plate/lid assembly leaves the upper surface 244 of electrode 206 exposed for cleaning and the openings 240 to gas distribution plate 208 exposed for cleaning as well.

Cleaning of built-up polymer on the exposed bottom surface 260 of gas distribution plate 208 is typically performed by blasting the surface 260 of the silicon carbide gas distribution plate 208 with dry ice ($CO_2$) to crack the polymer, followed by immersion of the gas distribution plate and electrode in a solvent tank and ultrasonic cleaning bath. The solvent composition within the solvent tank will depend on the materials from which the gas distribution plate and electrode are made and on the contaminants expected to be present on the surface of the gas distribution plate (which will depend on the particular gases and materials used during processes performed within the chamber).

Typically, a pin plate/lid assembly which has been removed from the chamber is replaced with a fresh pin plate/lid assembly, so that there is minimal downtime for the processing chamber. The pin plate/lid assembly which has been removed can then be sent out for cleaning and returned subsequently for further use.

When it is desired to use a plasma dry cleaning process for cleaning the chamber or for cleaning the exterior of the gas distribution plate 208, the pin plate must be in place, with pins 246 inserted into the openings 238 in electrode 206, in order to prevent a plasma from igniting within the showerhead assembly during the cleaning process. Plasma cleaning of the exterior of the showerhead assembly 200 can be performed using conventional methods known in the art, which will depend on the materials from which components of the processing chamber are made and on the contaminants expected to be present within the chamber (which will depend on the particular gases and materials used during processes performed within the chamber).

Figure 3:
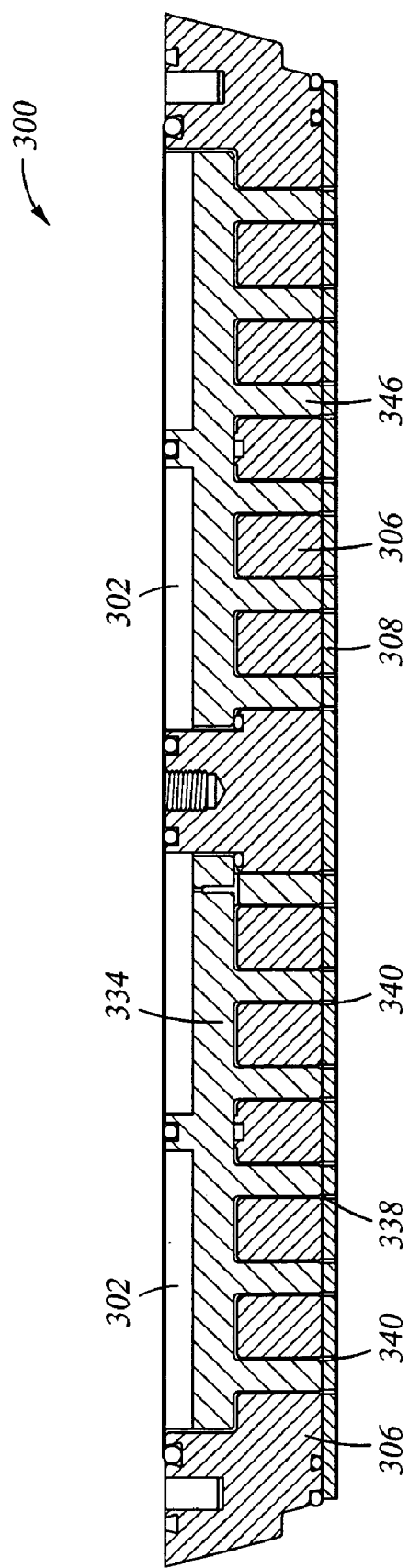
FIG. 3 shows a schematic of a cross-sectional view of a portion of a gas distribution showerhead assembly 300 according to the present invention, which is adapted for use in an Applied Materials' eMAX™ etch chamber which is capable of processing 200-mm diameter substrate wafers ("200-mm eMAX™"). The 200-mm eMAX™ gas distribution showerhead assembly 300 is very similar to the 300-mm eMAX™ gas distribution showerhead design shown in FIG. 2A.

FIG. 3 shows a schematic of a cross-sectional view of a portion of another gas distribution showerhead assembly according to the present invention. The gas distribution showerhead assembly 300 shown in FIG. 3 is adapted for use in an Applied Materials' eMAX™ etch chamber which is capable of processing 200-mm diameter substrate wafers ("200-mm eMAX™"). The gas distribution assembly 300 shown in FIG. 3 is similar in design to the gas distribution assembly 200 shown in FIGS. 2A–2D (which is adapted for use in an Applied Materials' 300-mm eMAX™ etch chamber).

Showerhead assembly 300 includes a gas plenum 302, an electrode 306, a gas distribution plate 308, and a removable pin plate 334. The electrode 306 includes a total of 133 through-holes 338.

The 300-mm e-MAX™ gas distribution showerhead assembly 200, shown in FIGS. 2–2D, included both an outer pin plate 234 and an inner pin plate 236. Due to its smaller size, the 200-mm eMAX™ gas distribution showerhead assembly 300 includes a single removable pin plate 334. The pin plate 334 includes a total of 133 pins 346, which fit into the 133 through-holes 338 in electrode 306.

The gas distribution plate 308, which is attached (typically bonded) to electrode 306, includes a total of 266 (two for each of the 133 through-holes and pins) crescent-shaped through-holes 340, where the spacing between walls of the crescent is about 0.010 inch maximum. The crescent-shaped through-holes 340 are spaced approximately 0.80 inch apart from each other. In this case, the through-holes 340 were formed in silicon carbide gas distribution plate 308 by ultrasonic machining. The silicon carbide gas distribution plate 308 has a thickness of 0.100 inch and a diameter of 10.88 inch.

Unlike the 300-mm eMAX™ chamber, the pin plate 334 of the 200-mm eMAX™ chamber is not bonded to the chill plate/lid (not shown). The pin plate 334 can be removed for cleaning by pulling it out after the chill plate/lid has been removed. No tools are required for removal of the pin plate 334 from the 200-mm eMAX™ etch chamber.

The above described embodiments are not intended to limit the scope of the present invention, as one skilled in the art can, in view of the present disclosure, expand such embodiments to correspond with the subject matter of the invention claimed below.

We claim:

1. A gas distribution showerhead assembly for use within a semiconductor processing chamber, including:
    an electrode having a plurality of openings therethrough;
    a gas distribution plate attached to a first, lower major surface of said electrode, wherein said gas distribution plate includes a plurality of through-holes for delivering processing gases into said semiconductor processing chamber; and
    a removable insert which fits into an opening in said electrode through which gas flows, wherein spacing between surfaces of said removable insert and surfaces of said electrode is adequate to permit gas flow, but inadequate for plasma ignition within the opening.

2. A gas distribution showerhead assembly in accordance with claim 1, wherein a gap between a surface of said removable insert and a surface of said electrode is 0.020 inch or less.

3. A gas distribution showerhead assembly in accordance with claim 2, wherein a gap between a surface of said removable insert and a surface of said electrode is within the range of about 0.010 inch to about 0.015 inch.

4. A gas distribution showerhead assembly in accordance with claim 1, wherein said removable insert comprises a removable pin plate including a plurality of pins, wherein said removable pin plate is disposed over a second, upper surface of said electrode in a manner such that said plurality of pins fits within said plurality of openings within said electrode.

5. A gas distribution showerhead assembly in accordance with claim 4, wherein a gap between an exterior surface of a pin and a surface of an opening in said electrode into which said pin fits is 0.020 inch or less.

6. The gas distribution showerhead assembly of claim 5, wherein a gap between an exterior surface of a pin and a surface of an opening in said electrode into which said pin fits is within the range of about 0.010 inch to about 0.015 inch.

7. A gas distribution showerhead assembly in accordance with claim 1, wherein said electrode is formed from a material selected from the group consisting of aluminum, ceramic, Si—Si carbide, and graphite converted to silicon carbide.

8. A gas distribution showerhead assembly in accordance with claim 7, wherein said electrode is formed from anodized aluminum.

9. A gas distribution showerhead assembly in accordance with claim 1, wherein said removable insert is formed from a material selected from the group consisting of aluminum, ceramic, Si—Si carbide, and graphite converted to silicon carbide.

10. A gas distribution showerhead assembly in accordance with claim 9, wherein said removable insert is formed from anodized aluminum.

11. A gas distribution showerhead assembly in accordance with claim 1, wherein said gas distribution plate is formed from a material selected from the group consisting of silicon carbide, yttrium oxide, anodized aluminum, ceramic, quartz, and silicon.

12. A gas distribution showerhead assembly in accordance with claim 11, wherein said gas distribution plate is formed from silicon carbide.

13. A gas distribution showerhead assembly in accordance with claim 1, wherein said electrode is formed from aluminum, wherein said gas distribution plate is formed from silicon carbide, and wherein said electrode and said gas distribution plate are bonded together.

14. A gas distribution showerhead assembly in accordance with claim 13, wherein said electrode and said gas distribution plate are bonded together using a silicone-based adhesive.

15. A gas distribution showerhead assembly in accordance with claim 1, wherein said through-holes in said gas distribution plate are crescent-shaped.

16. A gas distribution showerhead assembly in accordance with claim 15, wherein spacing between walls of said crescent is adequate to permit gas flow, but inadequate for plasma ignition within the opening.

17. A gas distribution showerhead assembly in accordance with claim 16, wherein spacing between walls of said crescent is 0.020 inch or less.

18. A gas distribution showerhead assembly in accordance with claim 17, wherein spacing between walls of said crescent is within the range of about 0.010 inch to about 0.015 inch.

19. A gas distribution showerhead assembly in accordance with claim 1, wherein said gas distribution showerhead assembly is adapted for use in a semiconductor processing chamber selected from the group consisting of an etch chamber and a chemical vapor deposition (CVD) chamber.

* * * * *